Figure 1:
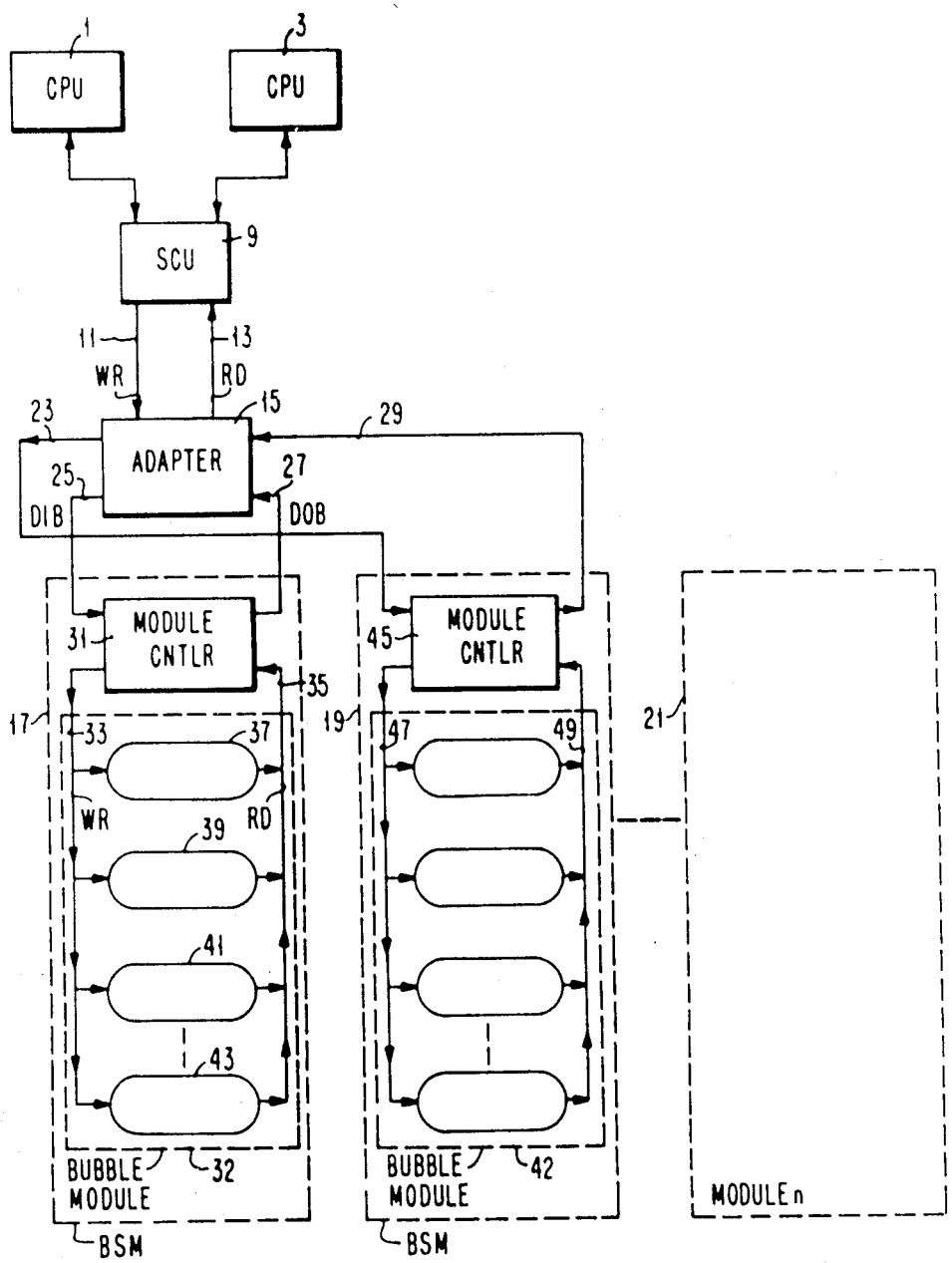
Figure 2:
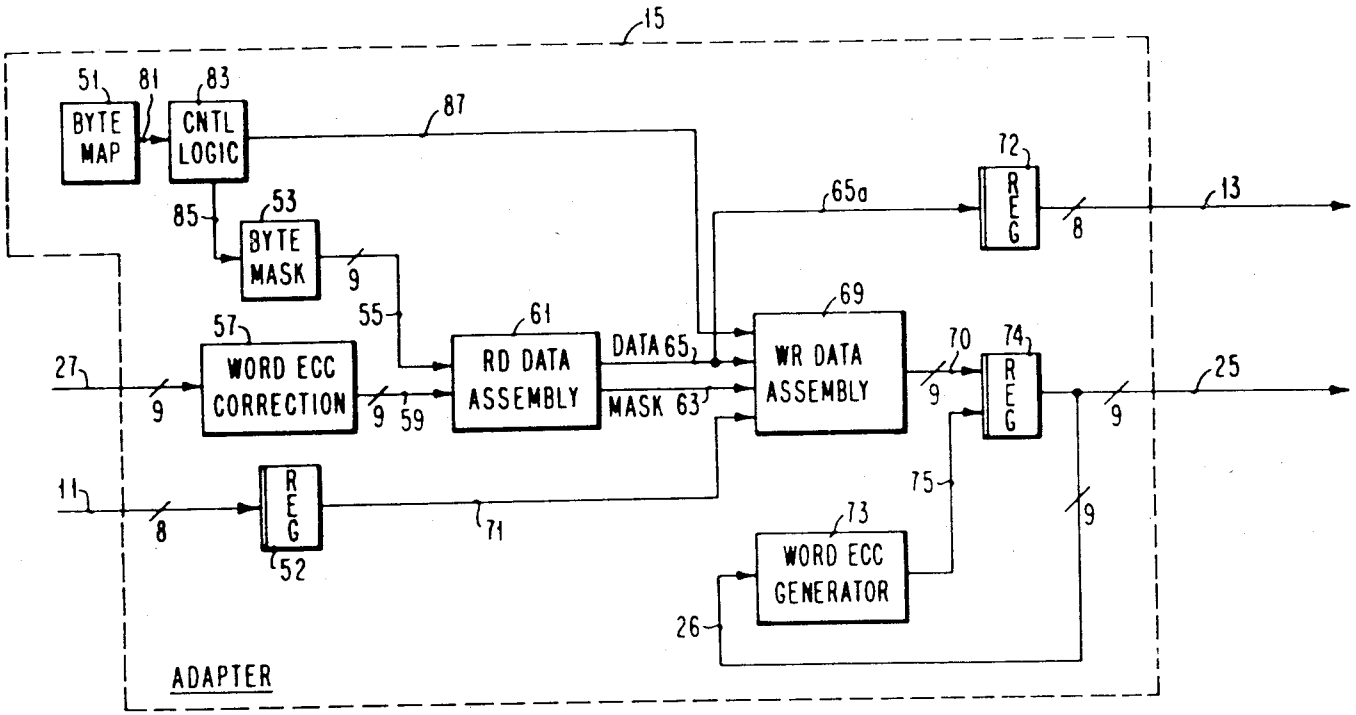
Figure 3:
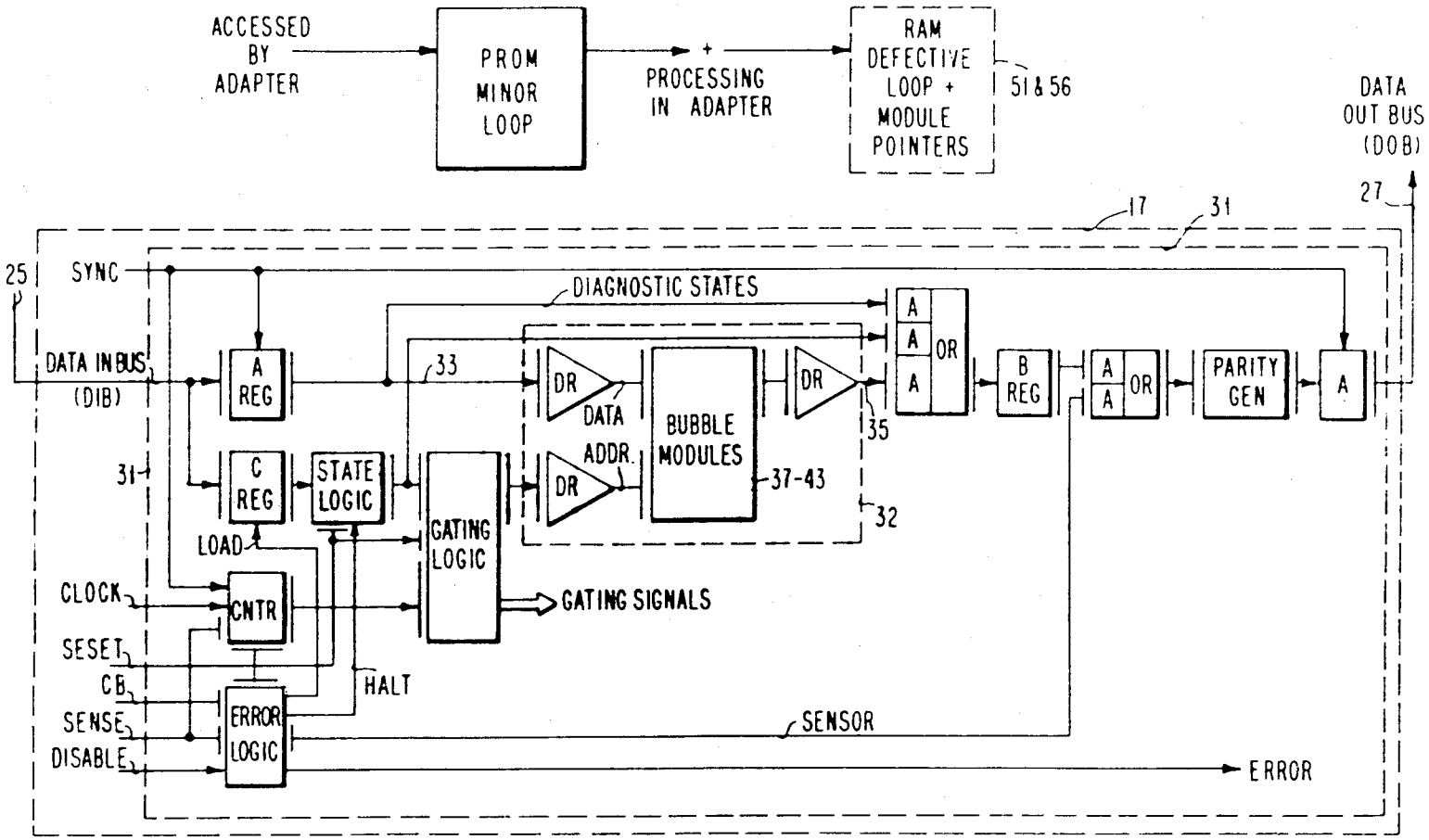
Figure 4:
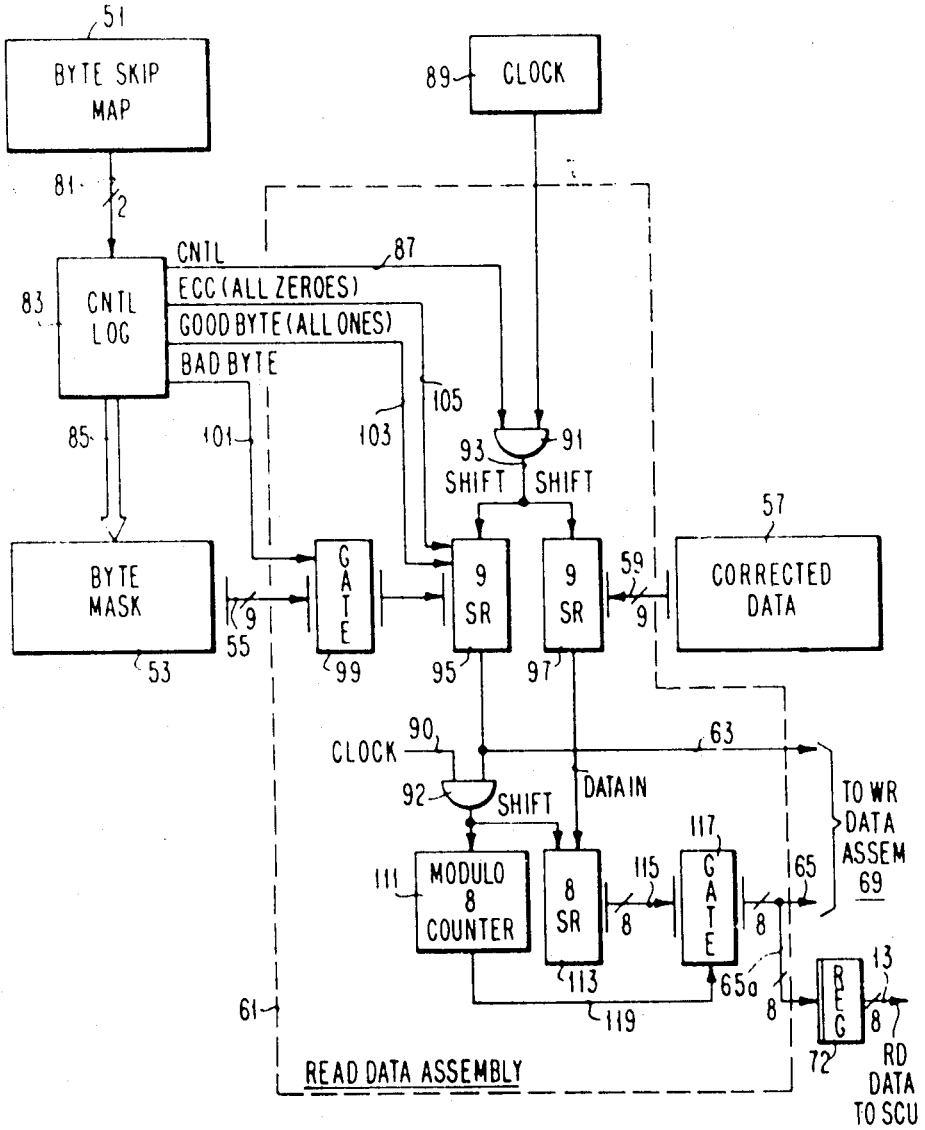
Figure 5:
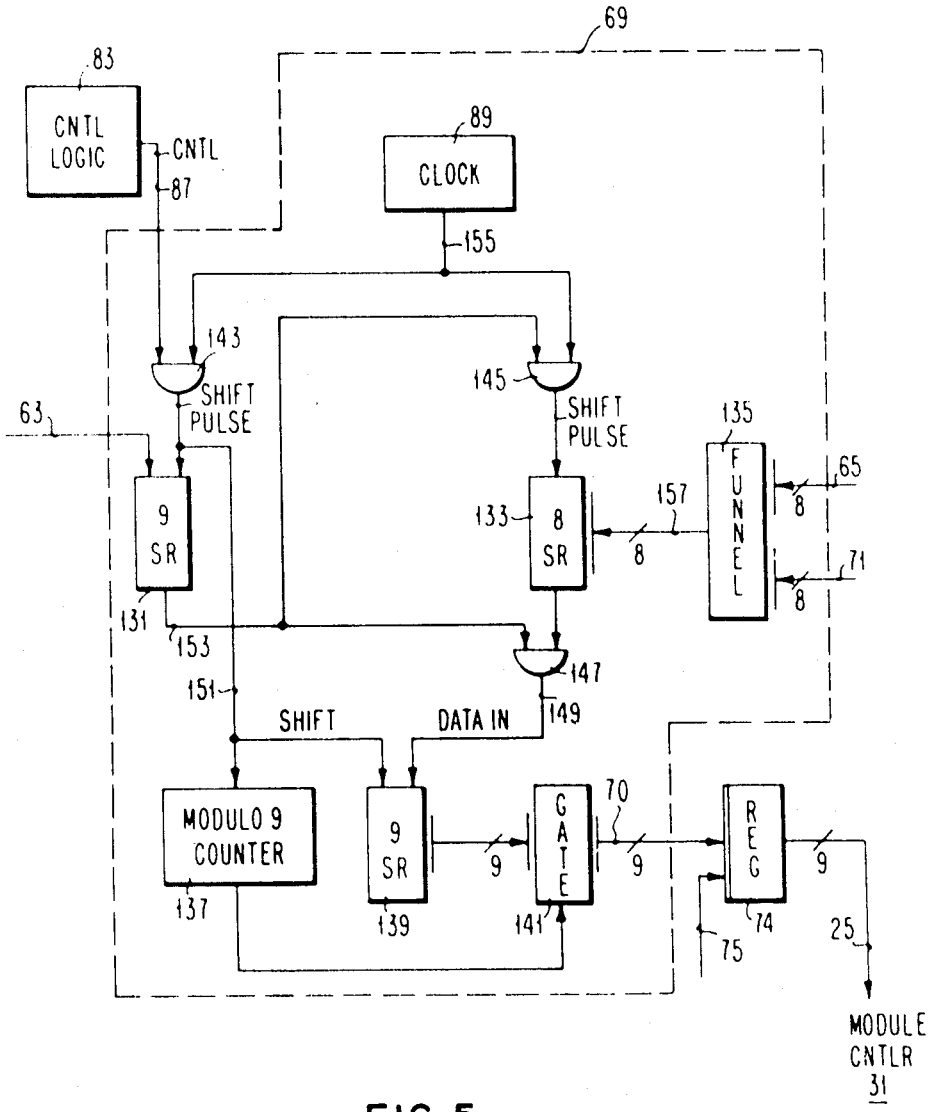
Figure 6:
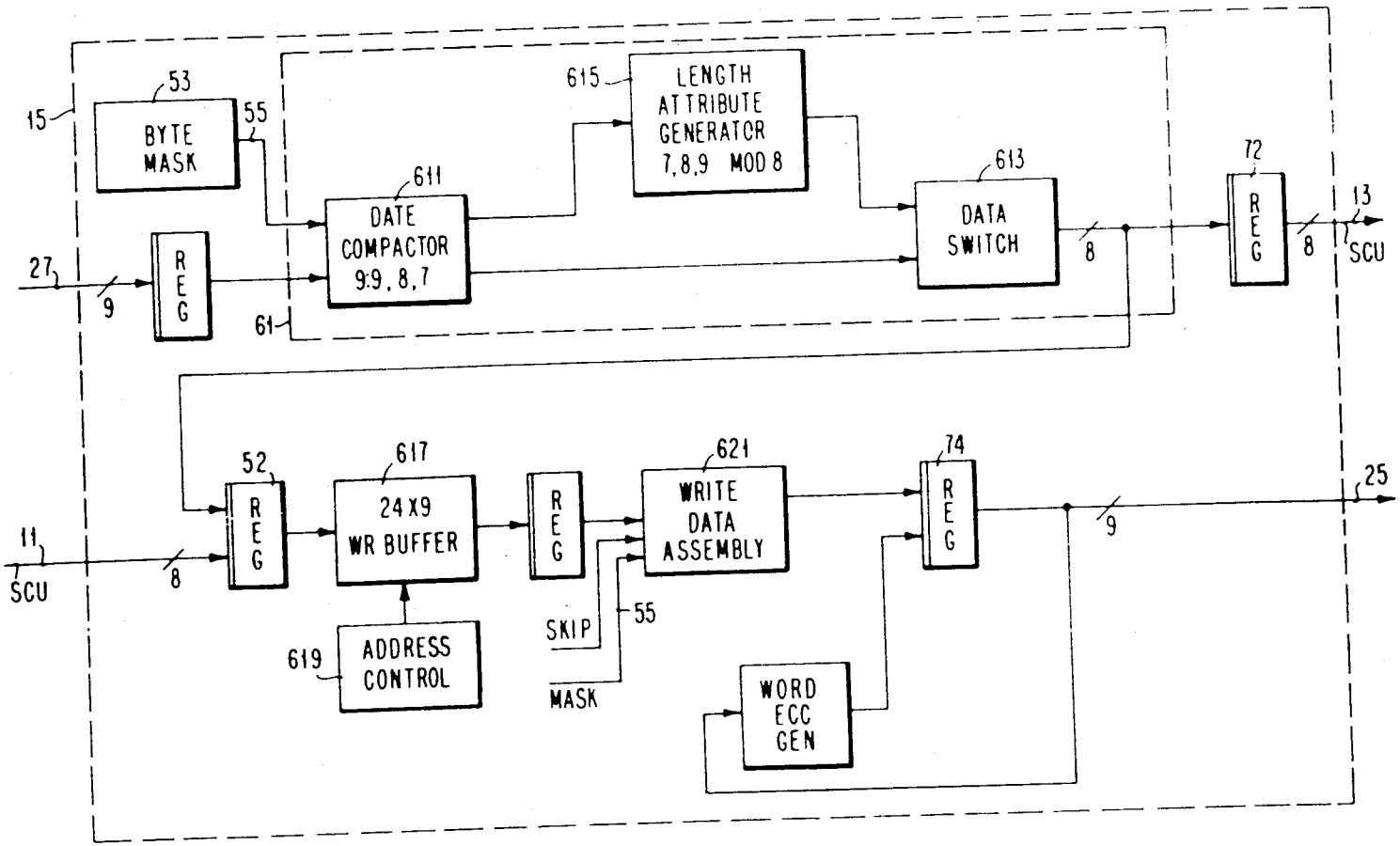

United States Defensive Publication [19] (H) [11] T100,402

Gindi et al. [43] Mar. 3, 1981

[54] METHOD AND MEANS FOR DEFECTIVE BIT PROCESSING IN A FAULT TOLERANT BUBBLE STORAGE SYSTEM

[75] Inventors: Abraham M. Gindi; Magdi R. Orfali; Arvind M. Patel, all of San Jose, Calif.

[73] Assignee: International Business Machines Corporation, Armonk, N.Y.

[21] Appl. No.: 166,718

[22] Filed: Jul. 7, 1980

Related U.S. Application Data

[63] Continuation of Ser. No. 66,272, Aug. 13, 1979.

[51] Int. Cl.[1] ..... G06F 11/08; G06F 11/00; G11C 19/08

[52] U.S. Cl. ..... 364/900; 365/15

[57] ABSTRACT

A method and means for modifying up to k bits in each byte of (n+k) bits to be accessed with respect to counterpart minor loops of a sequentially accessed byte-organized major/minor loop memory array. The combination of bad byte location pointers and a byte mask is used to delete bits on bad bytes extracted from the memory or to insert zeroes into defective loop locations when bad bytes are written into the memory. Alternatively, the ith bit in each byte of (n+1) bits to be accessed may be modified through the utilization of the value of the ith bit written into the byte position of n+1st bit, while the ith bit of a defective byte position is zeroed. As a bad byte is extracted, the value of the n+1st bit is substituted for the ith bit. A dense list, rather than a sparse bad byte pointer list, is used.

1 Claim, 6 Sheets Drawing,

25 Pages Specification

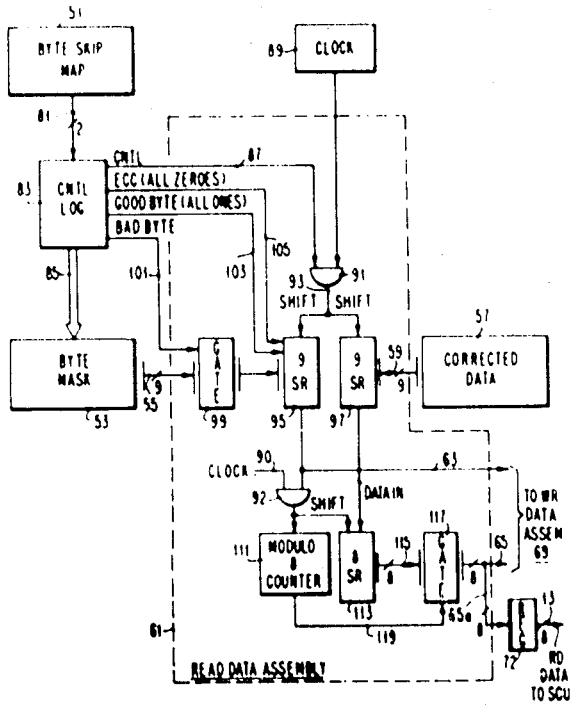

The file of this unexamined application may be inspected and copies thereof may be purchased (849 O.G. 1221, Apr. 9, 1968)